United States Patent
Breitschaedel et al.

(10) Patent No.: US 10,848,859 B1
(45) Date of Patent: Nov. 24, 2020

(54) LOUDSPEAKER-INDUCED NOISE MITIGATION

(71) Applicant: Apple Inc., Cupertino, CA (US)

(72) Inventors: Hannes Breitschaedel, Campbell, CA (US); Thomas M. Jensen, San Francisco, CA (US); Andrew P. Bright, San Francisco, CA (US)

(73) Assignee: Apple Inc., Cupertino, CA (US)

(*) Notice: Subject to any disclaimer, the term of this patent is extended or adjusted under 35 U.S.C. 154(b) by 140 days.

(21) Appl. No.: 16/257,422

(22) Filed: Jan. 25, 2019

(51) Int. Cl.
| | |
|---|---|
| H04R 3/04 | (2006.01) |
| H04R 1/28 | (2006.01) |
| H04R 9/06 | (2006.01) |
| H03G 3/24 | (2006.01) |
| H04R 1/04 | (2006.01) |
| H04R 1/02 | (2006.01) |
| G06F 9/30 | (2018.01) |

(52) U.S. Cl.
CPC ....... H04R 1/2873 (2013.01); G06F 9/30003 (2013.01); H03G 3/24 (2013.01); H04R 1/025 (2013.01); H04R 1/04 (2013.01); H04R 9/063 (2013.01)

(58) Field of Classification Search
CPC combination set(s) only.
See application file for complete search history.

(56) References Cited

U.S. PATENT DOCUMENTS

| | | | |
|---|---|---|---|
| 5,309,518 A | 5/1994 | Ickler et al. | |
| 9,491,541 B2 | 11/2016 | Breitschaedel et al. | |
| 9,648,422 B2 * | 5/2017 | Sheen | H04R 1/22 |
| 10,636,406 B2 * | 4/2020 | Fink | H04R 29/001 |

\* cited by examiner

*Primary Examiner* — Amir H Etesam
(74) *Attorney, Agent, or Firm* — Womble Bond Dickinson (US) LLP

(57) ABSTRACT

A method for mitigating noise caused by a loudspeaker in an audio device. The method obtains an audio signal for driving the loudspeaker. The method obtains a system model of the audio device that represents a modeled physical characteristic of the audio device, and determines whether a noise level of loudspeaker induced acoustic noise is greater than a desired sound level by analyzing the audio signal according to the system model, where the noise level and the desired sound level are characterized at the listener's position in an acoustic environment. The method, in response to determining that the noise level is greater than the sound level, processes the audio signal to cause a reduction of the noise level.

20 Claims, 5 Drawing Sheets

LOUDSPEAKER-INDUCED NOISE MITIGATION

FIELD

An aspect of the disclosure relates an audio system for mitigating the audibility of noise caused by the audio system while a loudspeaker of the audio system is producing sound.

BACKGROUND

Acoustic noise may be any unwanted (or unpleasant) sound that is produced in an acoustic domain. Such noise is unwanted when it interferes with a person's ability to listen to other sounds (e.g., music) that are being produced simultaneously by playback on an audio device (e.g., a laptop computer, a tablet computer). For example, a buzzing sound may be produced by a resonating mechanical component of the audio device when a loudspeaker in the device is operating at considerable levels.

SUMMARY

An aspect of the disclosure is a method performed by an audio device that has a loudspeaker integrated therein (e.g., a laptop) for mitigating loudspeaker-induced acoustic noise caused by the audio device while the loudspeaker plays back desired sound. In one aspect, the noise is mitigated when the noise is determined to be audible over the desired sound.

To accomplish this, the audio device determines whether the noise is audible over the sound produced by the loudspeaker as perceived by a listener of the device. To make this determination, the audio device obtains an audio signal and estimates the audibility of desired sound produced by the loudspeaker when driven by the audio signal at a listener's position in an acoustic environment. For instance, the audio device determines a loudness (or a desired sound level) of the desired sound at the listener's position. The audio device is thus using the desired sound as a masking threshold from which to determine if any noise induced by the loudspeaker of the audio device is audible to the listener.

In one aspect, the device obtains a system model that represents a modeled physical characteristic of the audio device, such as a port outlet or a physical button of the device. The device analyzes the audio signal according to the system model, to determine a noise level of loudspeaker-induced acoustic noise caused by the physical characteristic that would be generated at the listener's position in the acoustic environment while the loudspeaker is driven by the audio signal. The audio device determines whether the noise level of the loudspeaker-induced acoustic noise is greater than the desired sound level, where both the noise level and the desired sound level are characterized at the listener's position. In response to determining that the noise level is greater than the sound level (e.g., the noise is heard over the desired sound), the device processes the audio signal to cause a reduction in the noise level. For instance, the audio device may adjust the gain of the audio signal to cause the loudspeaker to produce the desired sound at a lower volume, thereby also reducing the noise level of the noise.

In one aspect, the audio device produces the masking threshold based on the desired sound or ambient sound that is already present within the acoustic environment. For instance, although the loudspeaker-induced noise may be perceived over the desired sound, ambient sound already present within the acoustic environment may in fact mask the noise. As an example, in the case of a busy coffee shop, sound of customers may dilute the induced noise. Thus, in one aspect, the audio device decides which of the desired sound or the ambient sound is to act as the masking threshold based on which sound has a higher sound level. This decision may be based on a comparison of the sounds to determine which has a higher amplitude, or the decision may be based on a comparison of energy levels of certain frequency bins.

In another aspect, the audio device produces the masking threshold based on a combination of the desired sound and the ambient sound within the acoustic environment.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The aspects of the disclosure are illustrated by way of example and not by way of limitation in the figures of the accompanying drawings in which like references indicate similar elements. It should be noted that references to "an" or "one" aspect of the disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

DETAILED DESCRIPTION

Several aspects of the disclosure with reference to the appended drawings are now explained. Whenever the shapes, relative positions, and other aspects of the parts described in the aspects are not explicitly defined, the scope of the disclosure is not limited only to the parts shown, which are meant merely for the purpose of illustration. Also, while numerous details are set forth, it is understood that some aspects of the disclosure may be practiced without these details. In other instances, well-known circuits, structures, and techniques have not been shown in detail so as not to obscure the understanding of this description.

Audible noise may be induced by a loudspeaker of an audio system that is producing (or playing back) user-desired sound, such as music. The emission of this noise may interfere with the desired sound by degrading the sound quality of the sound when both are heard (or perceived) by a listener. Such loudspeaker-induced acoustic noise (or hereafter may be referred to as "loudspeaker-induced noise"), may be nonlinear distortion artifacts that are the result of vibrations and/or air flow caused by movement of the loudspeaker's diaphragm. For example, vibrations caused by the loudspeaker's diaphragm may resonant a mechanical component of the audio device, resulting in audible noise. In that case, a solution may be to configure a filter that attenuates a resonance-stimulating frequency component of the audio signal that is input to the loudspeaker, when strength of that frequency component in the audio signal exceeds a threshold.

Figure 1:
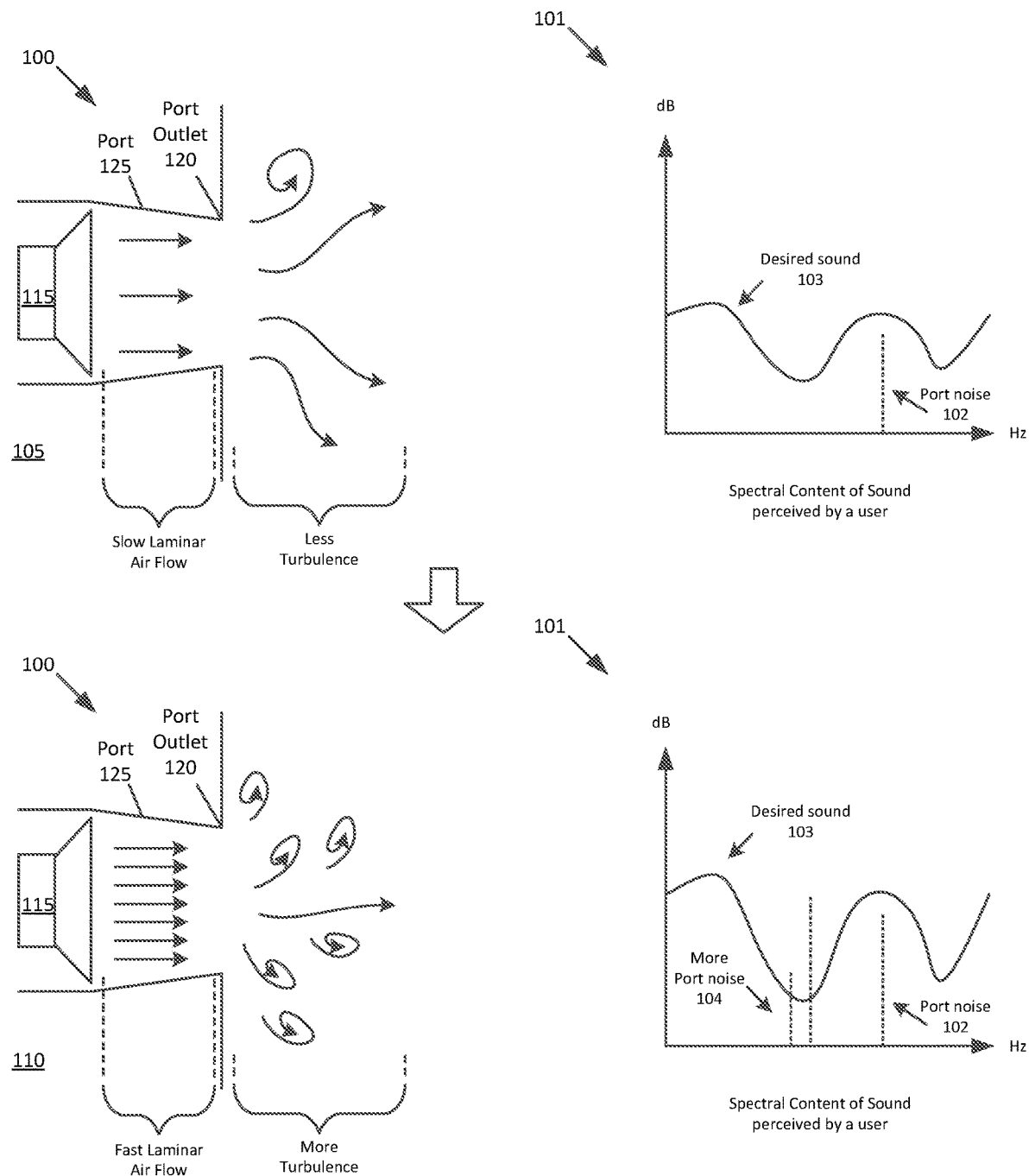
FIG. 1 shows port noise beginning to interfere with desired sound being played back by an audio device, due to laminar air flow exiting an audio port at a faster rate.

Another example of loudspeaker-induced noise is "port noise" that is caused by air exiting a loudspeaker port or outlet of an audio device (that has a loudspeaker integrated therein.) The device may be a smartphone, a laptop computer or a tablet computer. FIG. 1 illustrates an example of how port noise interferes with desired sound being played back by an audio device. Specifically, FIG. 1 shows two stages 105 and 110 of a cross section of a loudspeaker port 125 of an audio device 100 having a loudspeaker 115 producing the sound of user content audio, and a graph 101 of the spectral content of sound being perceived by a user of the audio device. The graph 101 illustrates the spectral features of sounds as sound level or sound energy in logarithmic form with respect to frequency.

Stage 105 shows that port noise 102, illustrated as a single tone in the graph 101, is not interfering with (it is being masked by) the desired sound 103 produced by the loudspeaker 115. The port noise 102 is the result of a laminar-turbulent transition process. For instance, while the loudspeaker 115 plays back sound 103, its diaphragm acts as a piston by pushing air in a frontal direction towards the port outlet 120. This air travels through the loudspeaker port 125 in a laminar flow (as shown by straight arrows). As the air travels through the port 125, a cross-sectional area of the port decreases similar to a funnel in which a larger cross-sectional area is at the loudspeaker 115 and a smaller cross-sectional area is at the outlet 120 of the port 125. In one aspect, the funnel shape of the port 125 results in the air increasing in velocity as it travels towards the port outlet 120. The air travels through the port 125 until it reaches the port outlet 120. At that point, the abrupt change from traveling through the port 125 at a high velocity to exiting the port outlet 120 into the open air causes the exiting air to become turbulent (as shown by wavy lines and one eddy). In stage 105, there is little turbulence caused by the air exiting the loudspeaker port outlet 120, which is due to the slow laminar air flow through the loudspeaker port 125. In this example, the laminar air flow is slow because the loudspeaker 115 is playing back the desired sound at a low volume. The graph 101 shows the spectral content of the desired sound 103 and the noise 102 as heard by a user. Specifically, the graph 101 illustrates that the spectral content of the desired sound 103 produced by the loudspeaker 115 is audibly masking the port noise 102. Audible masking occurs when the perception of one sound is affected by the presence of another sound. In this case, the user who is listening to the desired sound 103 is unable to distinguish the port noise 102 from the desired sound 103, since the amplitude (or sound level) of the port noise 102 is below the desired sound 103. Thus, desired sound 103 is acting as a masking threshold where a sound (such as the port noise 102) having a sound level below the desired sound 103 is indistinguishable from the desired sound 103 to the listener.

Stage 110 shows that the port noise 102 is interfering with the desired sound 103 that is being produced by the loudspeaker 115. This stage shows that the diaphragm of the loudspeaker 115 is working harder or vibrating faster, causing an increase in the velocity of the laminar air flow (as shown by having more straight arrows than in stage 105). In this example, the loudspeaker 115 is working harder because the volume of the sound has been increased. When the faster laminar air flow exits the port outlet 120, it will encounter more turbulence (as shown by having six eddies, as opposed to the one eddy in stage 105). This increase in turbulence causes an increase in the amount and amplitude of the sound level of port noise, as shown in graph 101. For instance, although the amplitude of the desired sound 103 has increased because of the increase in volume, the desired sound 103 is no longer masking all of the port noise. Since the port noise is nonlinear, the increase in turbulence causes additional tones of port noise 104 to occur, along with an increase in the amplitude of the original port noise 102. Unlike the port noise 102 that is still being masked by the desired sound 103, these additional tones 104 are not being masked by the desired sound 103 since their sound level has surpassed the masking threshold of the desired sound 103. Therefore, the additional tones 104 in this stage are being perceived by the user.

An aspect of the disclosure is a method performed by an audio device that has a loudspeaker integrated therein (e.g., a laptop) for mitigating loudspeaker-induced acoustic noise caused by the audio device while the loudspeaker plays back desired sound, when the noise is audible over desired sound. Specifically, the audio device is to mitigate the noise when it is determined that such noise may be heard by a listener. This is in contrast to conventional approaches that may filter sound when a frequency component exceeds a threshold, regardless of whether or not the noise is actually heard by a listener.

Figure 2:
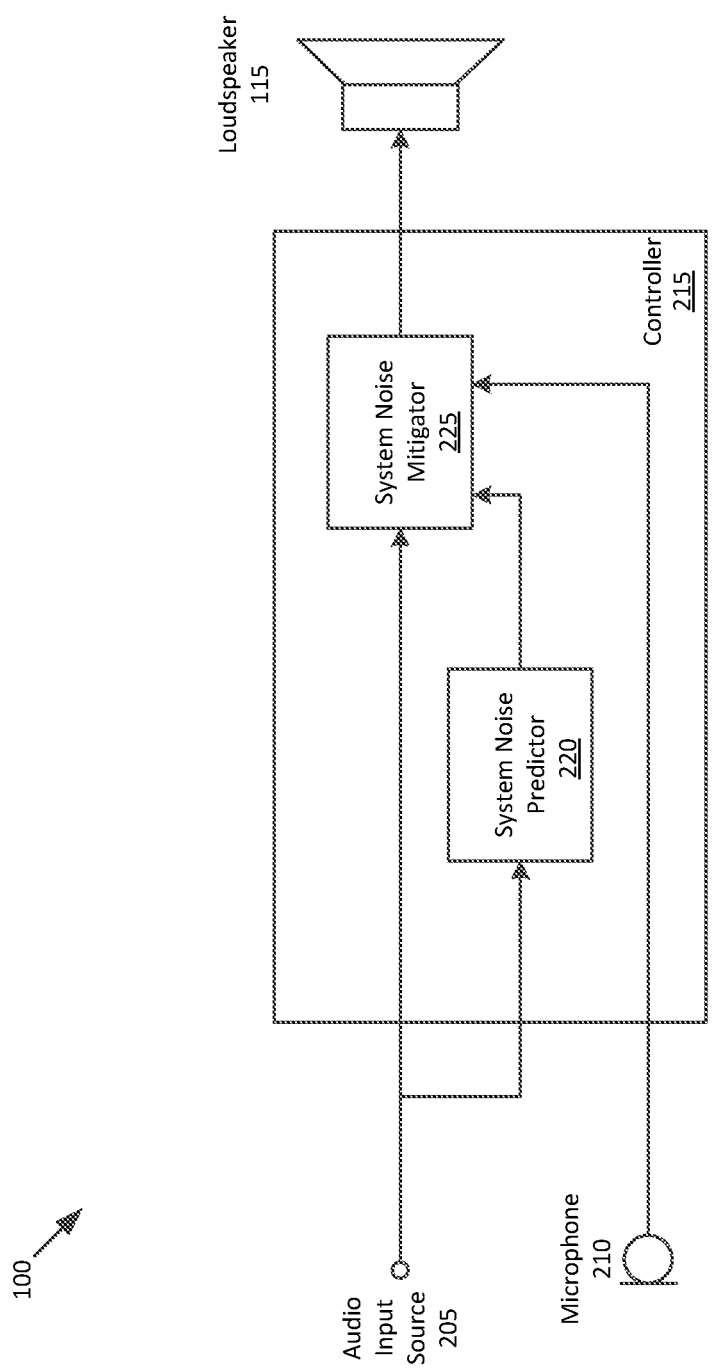
FIG. 2 shows a block diagram of the audio device according to one aspect of the disclosure.

FIG. 2 shows a block diagram of the audio device 100 of one aspect that mitigates loudspeaker-induced acoustic noise. The audio device 100 includes an audio input source 205, a microphone 210, the loudspeaker 115, and a controller 215. The device 100 may be any electronic device that includes a loudspeaker (e.g., integrated therein), such as a desktop computer, a home audio system, any consumer electronics device with audio capability, and an audio system in a vehicle (e.g., an automobile infotainment system). In one aspect, the audio device 100 may be a wireless portable device, such as a smartphone, a tablet, or laptop. The audio device 100 may be wireless such that it can establish a wireless connection link (e.g., using BLUETOOTH protocol, a wireless local network link, or any other wireless communication method) with another electronic device in order to exchange data packets (e.g., Internet Protocol (IP) packets). The microphone 210 may be any type of microphone (e.g., a differential pressure gradient micro-electro-mechanical system (MEMS) microphone) that is configured to convert acoustical energy caused by sound wave propagating in an acoustic environment into an input microphone signal. The loudspeaker 115 may be an electrodynamic driver that may be specifically designed for sound output at certain frequency bands, such as a subwoofer, tweeter, or midrange driver, for example. In one aspect, the loudspeaker 115 may be a "full-range" (or "full-band") electrodynamic driver that reproduces as much of an audible frequency range as possible.

The controller 215 may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). The controller includes a system noise predictor 220 and a system noise mitigator 225. In one aspect, the predictor 220 and mitigator 225 may be implemented in software (e.g., as instructions stored in memory and executed by the controller 215) or may be implemented by hardware logic structures as described above. In another aspect, the predictor 220 and mitigator 225 may be implemented differently from one another.

The controller 215 is to receive an input audio signal (channel) of a piece of sound program content from an input audio source 205 for driving the loudspeaker 115 to produce desired sound. The input audio source 205 may provide a digital input or an analog input. The input audio source 205 may include a programmed processor that is running a media player application program and may include a decoder that is producing the digital audio input to the controller 215. To do so, the decoder may be capable of decoding an encoded audio signal, which has been encoded using any suitable audio codec, such as, e.g., Advanced Audio Coding (AAC), MPEG Audio Layer II, MPEG Audio Layer III, or Free Lossless Audio Codec (FLAC). Alternatively, the input audio source 205 may include a codec that is converting an analog or optical audio signal, from a line input, for example, into digital form for the controller 215. Alternatively, there may be more than one input audio channel, such as a two-channel input, namely left and right channels of a stereophonic recording of a musical work, or there may be more than two input audio channels, such as for example the entire audio soundtrack in 5.1-surround format of a motion picture film or movie.

The system noise predictor 220 is to receive the audio input signal from the audio input source 205. The system noise predictor 220 is to obtain a system model of the audio device 100. In one aspect, the system model represents a modeled physical characteristic of the audio device 100, such as the port outlet 120 illustrated in FIG. 1. The system noise predictor 220 is to analyze the audio input signal according to the system model to determine (or predict) loudspeaker-induced acoustic noise that is caused when the loudspeaker 115 plays back the audio input signal. More about the operations performed by the system noise predictor 220 is further described herein.

The system noise mitigator 225 is to receive the determined loudspeaker-induced noise, and to mitigate the noise when the mitigator determines that the noise is audible over 1) the sound produced by the loudspeaker when driven by the input audio signal and/or 2) the ambient sound within the acoustic environment in which the audio device is located. Specifically, the mitigator 225 determines whether the noise is to be audibly masked by these other sounds (either separately or combined), which may represent a masking threshold, such as the sound 103 of FIG. 1. When the noise is audible (e.g., above the masking threshold), the mitigator 225 is to perform audio processing operations upon the audio input signal such that when the audio input signal is used to drive the loudspeaker 115 to produce sound, noise induced by the loudspeaker is reduced to at least below the masking threshold. By being below the masking threshold, the noise will not be heard (or be audible) over other sounds by the user of the audio device. In one aspect, the performance of the audio processing operation eliminates (or cancels) the noise entirely. More about the operations performed by the system noise mitigator 225 is further described herein.

Figure 3:
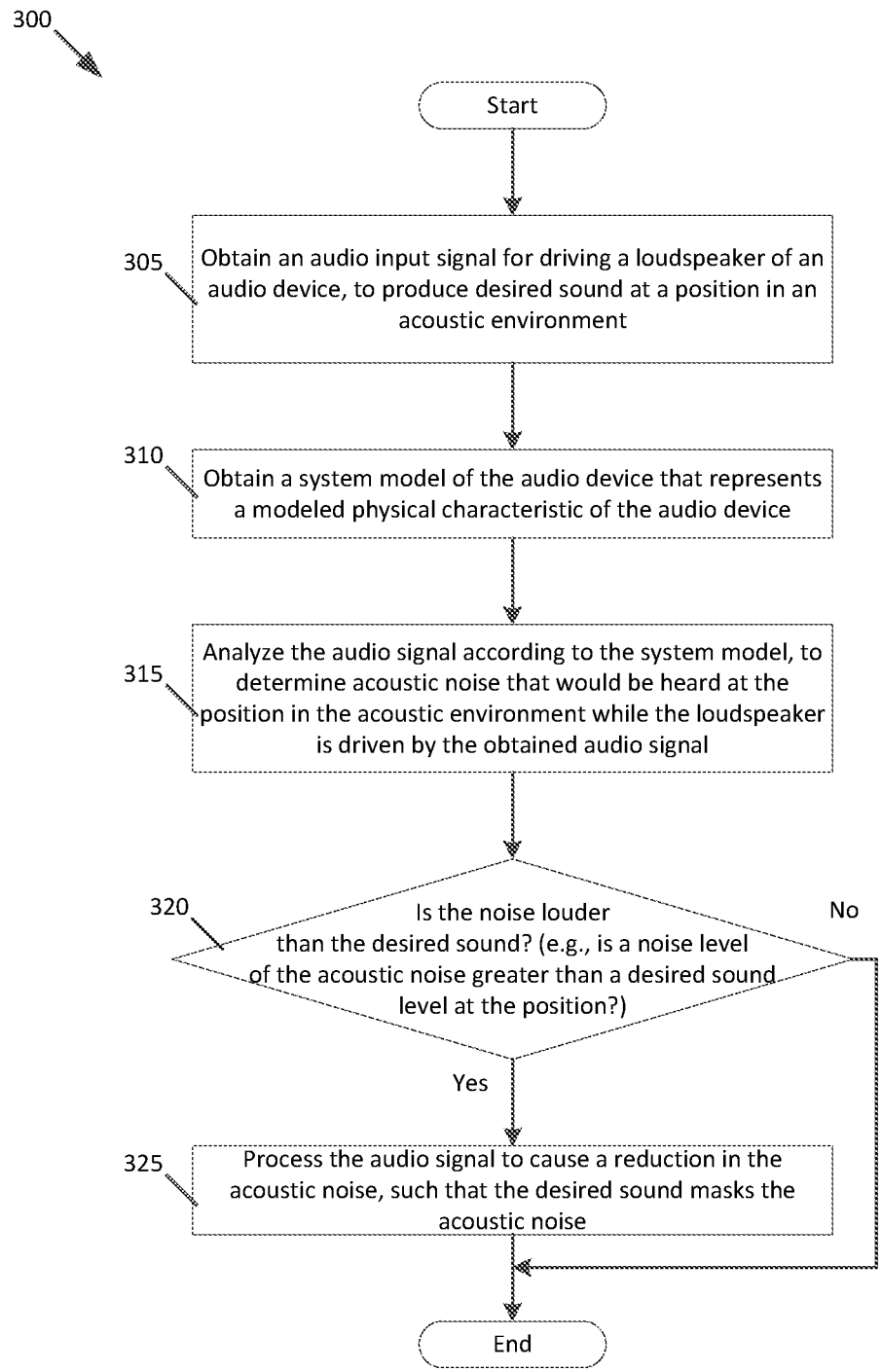
FIG. 3 is a flowchart of one aspect to perform a noise mitigation process.

FIG. 3 is a flowchart of one aspect of a process 300 to mitigate loudspeaker-induced acoustic noise. In one aspect, the process 300 is performed by the (e.g., controller 215 of the) audio device 100, as described in FIG. 2. More specifically, the process 300 may be performed by the predictor 220 and/or mitigator 225 of the controller 215. The process 300 will be described with reference to FIG. 2. In FIG. 3, the process 300 begins by obtaining an audio input signal for driving the loudspeaker 115 of the audio device 100, to produce desired sound at a listener's position in an acoustic environment in (at block 305).

The process 300 obtains a system model of the audio device 100 that represents a modeled physical characteristic of the audio device 100 (at block 310). The process 300 analyzes the audio signal according to the system model to determine loudspeaker-induced noise that would be heard at the listener's position in the acoustic environment when the loudspeaker 115 is driven by the audio signal (at block 315). The process 300 determines if the noise is louder than the desired sound (at decision block 320). Specifically, the controller 215 determines if the noise will be audible over the desired sound at the position in the acoustic environment. For instance, the controller 215 determines whether a noise level of the loudspeaker induced acoustic noise is greater than a desired sound level of the desired sound. In response to determining that the noise level is greater than the desired sound level, the process 300 processes the audio input signal to cause a reduction in the noise (e.g., to reduce the noise level), such that the desired sound masks the noise (at block 325). Otherwise the process 300 ends.

Some aspects perform variations of the process 300. For example, the specific operations of the process 300 may not be performed in the exact order shown and described. The specific operations may not be performed in one continuous series of operations and different specific operations may be performed in different aspects.

Figure 4:
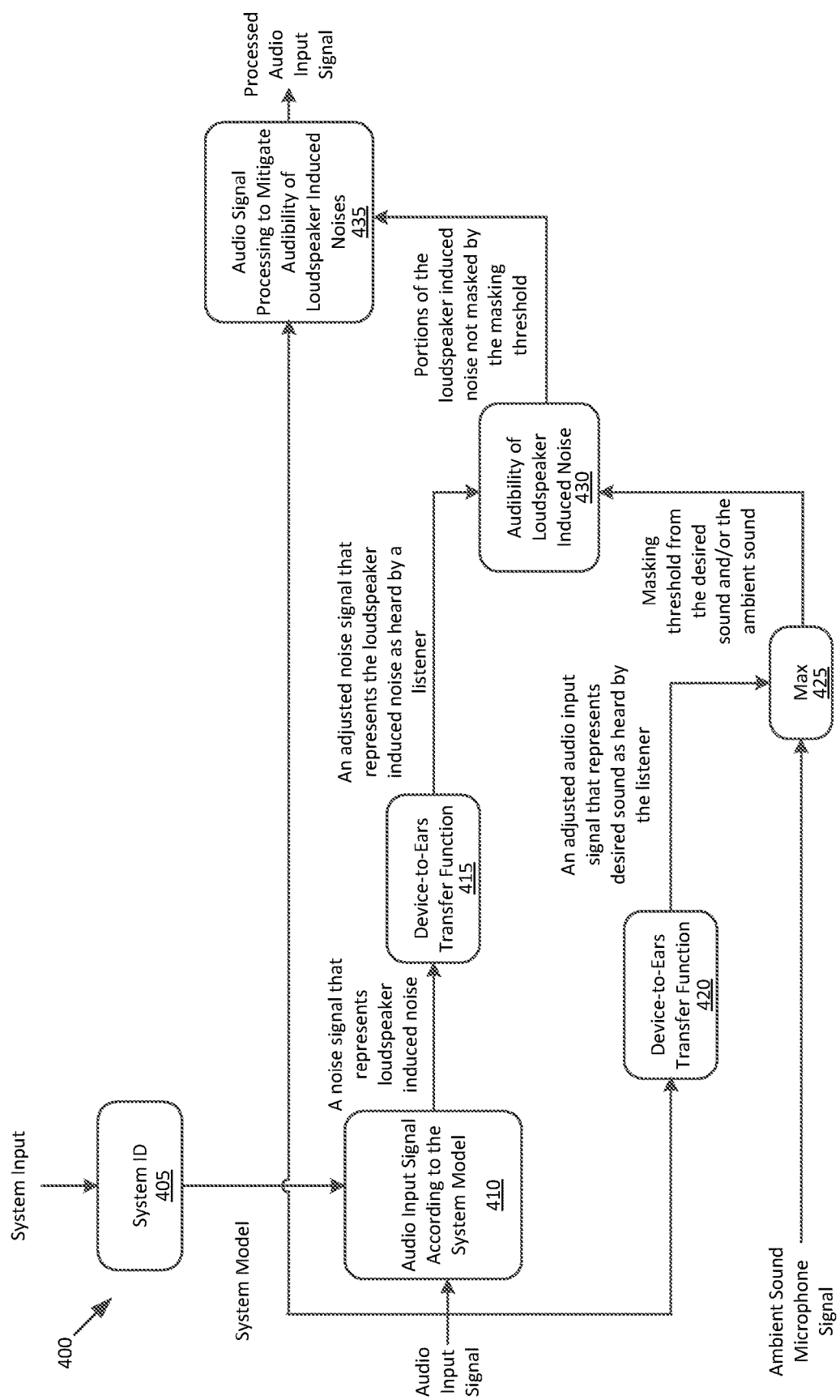
FIG. 4 shows a block diagram of operations to mitigate loudspeaker-induced acoustic noise according to one aspect of the disclosure.

FIG. 4 shows a block diagram 400 of the operations performed by the controller 215 to mitigate the loudspeaker-induced acoustic noise according to one aspect. The operations performed within the block diagram 400 may be performed by the predictor 220 and/or the mitigator 225 of the controller 215. The block diagram 400 will be described with reference to FIGS. 1-3. The block diagram 400 begins by the predictor 220 obtaining (or receiving) system input that includes one or more parameters associated with physical components of the audio device 100 (at block 405). In one aspect, the parameters may include indications of a physical change of the audio device 100, such as an indication that a position of a component of the audio device 100 has moved. For example, the parameters may indicate that a physical button of the audio device 100 has been pressed (e.g., a vertical displacement of how much the physical button has been depressed). As another example, the parameters may include sensor data produced by one or more sensors integrated within the device 100. For instance, the parameters may indicate an internal temperature reading captured by a temperature sensor, or pressure reading that is measured by a barometer. As yet another example, the parameters may be associated with audio hardware components of the audio device 100, such as the loudspeaker 115, an amplifier that drives the loudspeaker 115, etc. For instance, the parameters may include a voltage reading across a voice coil of the device's loudspeaker 115 or a reading of the current drawn by the amplifier driving the loudspeaker 115.

In one aspect, the audio device 100 may include a library of predefined system models that are associated with system identifiers (or system IDs) and/or parameters. In one aspect, the system models each represent a modeled physical characteristic of an audio device, such as the port outlet 120 of audio device 100 of FIG. 1. These system models may have been produced in a controlled environment (e.g., a laboratory) and stored in local memory of the device 100. In one aspect, at block 405 the predictor 220 obtains a system model, according to a system identifier that is associated with the audio device 100 and/or the obtained parameters from the system input. To accomplish this, the predictor 220 may perform a table lookup into the library using the system identifier and/or parameters. Specifically, the predictor 220 may use a system identifier associated with device 100 to identify system models that are associated with this particular device; and the parameters may be used to narrow down a particular system model of a physical characteristic associated with the parameters for selection. For instance, if the parameter indicated a change of a physical button, the selected system may represent a model of the physical button. In one aspect, the system model may be obtained from a remote server via a wireless network.

In some aspects, the obtained predefined system model may be modified according to the system input. In particular, the predefined system models may be generic system models of modeled physical characteristics where a current model of the characteristic may be interpolated using the parameters of the system input. For instance, the predictor 220 may perform a table lookup using the system identifier (and the parameters) to retrieve the generic system model. Once retrieved, the predictor 220 may modify the model according to the parameters obtained through the system input.

The predictor 220 proceeds to analyze the audio input signal according to the system model to predict loudspeaker-induced noise (at block 410). Specifically, the system model is applied to the audio input signal to estimate a noise signal that represents noise that would be generated if the loudspeaker 115 were to produce sound corresponding to the audio input signal. For example, such noise, as previously described, may be the result of internal system vibrations caused by the diaphragm of the loudspeaker 115. In one aspect, the noise occurs when these vibrations are at a resonance frequency of the physical characteristic. As another example, in the case of a system model representing the port outlet 120, the result of applying a model of the port outlet to the audio input signal results in a prediction of port noise, such as the port noise 102 of FIG. 1.

In some aspects, to determine the loudspeaker-induced noise, the controller 215 determines (or estimates) conditions caused by the loudspeaker 115 as it is driven by the audio input signal. For instance, the controller 215 may estimate the vibrations and/or air velocity that would be caused by the diaphragm of the loudspeaker 115 when driven by the audio input signal. To do this, the controller may model the loudspeaker 115 according to parameters obtained by the system input, such as the voltage reading and/or current reading of the loudspeaker 115, as previously described. The model of the loudspeaker 115 is applied to the audio input signal to estimate the conditions of the loudspeaker 115. These estimated conditions are applied to the system model of the physical characteristic, which results in the predicted loudspeaker-induced noise. In some aspects, the system model may account for the modeled physical characteristic and a model of the loudspeaker 115.

In one aspect, the determined loudspeaker-induced noise may represent the audibility of noise as it originates from the physical characteristic of the audio device 100. Specifically, the noise signal has an originating noise (or energy) level at the physical characteristic. Although the noise level may be high at (or proximate) to the physical characteristic, a user may still be unable to hear the noise if the user is positioned far away from the audio device 100. For example, sound emitted in an acoustic environment dissipates and becomes more diffuse as it travels through the environment. Thus, although noise may be audible proximate to its origin, it may become less audible as it spreads throughout the environment. To account for this, the process 400 obtains a "device-to-ears" transfer function that represents a response between the audio device 100 (or more specifically the modeled physical characteristic) and a position in the acoustic environment (e.g., the position of a listener), and applies the transfer function to the determined loudspeaker-induced noise to determine the audibility of the noise (e.g., as heard) by a listener at a position within the acoustic environment (at block 415). Specifically, the controller 215 applies the transfer function to the noise signal to produce an adjusted noise signal that accounts for the travel path between the physical characteristic (e.g., port outlet 120) of the audio device 100 to the ears of the user. In one aspect, the noise signal has an adjusted noise level, which may be quieter than the noise's originating noise level.

In some aspects, the predictor 220 determines the device-to-ears transfer function to be applied to the input audio signal based on certain criteria. For instance, since the transfer function is based on the travel path between the device 100 and the listener, the predictor 220 may determine the transfer function based on a determination of the position of the listener, with respect to the device 100. Or more specifically, with respect to the loudspeaker 115. In one aspect, the predictor 220 may determine the position of the listener according to user preferences (e.g., as defined by the user). In some aspects, the transfer functions may be defined based on knowledge that listeners may be at a known distance (and location) away from certain devices. For example, when the audio device 100 is a laptop, users may be within a particular position since such users are normally within arm's reach. In other aspects, the transfer function is learned through a machine learning algorithm. In some aspects, the device-to-ears transfer function may be predefined in a controlled environment (e.g., laboratory), and stored within local memory of the audio device 100. In some aspects, the transfer function may be any type of transfer function, such as a Head-Related Transfer Function (HRTF).

In some aspects, the predictor 220 determines the device-to-ears transfer function to be applied to the input audio signal based on current physical and/or operational characteristics of the audio device 100. For example, the predictor 220 may determine the transfer function based on the orientation of the device 100 with respect to the listener. In the case of a smartphone, the predictor 220 may apply a particular transfer function when the device is vertical (e.g., being held upright by the listener), and may apply a different transfer function when the device is horizontal (e.g., being laid down on a surface). Different transfer functions may be applied in these instances, since the location of the audio device's loudspeaker with respect to the listener may change based on the device's orientation.

In one aspect, the predictor 220 may determine the transfer function based on whether the device 100 is in a "handset mode" (e.g., in the case of the audio device 100 being a smartphone). For instance, the predictor 220 may determine that the device 100 is being held against the listener's ear. In this aspect, the position at which the noise level and the desired sound is to be characterized, may be proximate (or at) the position of the loudspeaker 115. In this case, the transfer function may represent a travel path between the origin of the noise and the position of the loudspeaker 115.

The mitigator 225 determines the audibility of determined loudspeaker-induced noise at the position of the listener, in relation to other sounds within the environment. Specifically, the mitigator 225 determines whether the determined acoustic noise is masked by the other sounds, such as desired sound (e.g., 103) or ambient sound that is present within the acoustic environment. To do this, the mitigator 225 analyzes the audio input signal according to the device-to-ears transfer function to estimate the audibility of the desired sound as heard by the listener at the position within the acoustic environment (at block 420). In some aspects, as previously described, this adjusted audio input signal represents the sound that the listener wants to hear play through the loudspeaker 115. Thus, similar to the operations performed at block 415, the mitigator 225 obtains and applies the transfer function to the audio input signal to produce an adjusted audio input signal that accounts for the travel path between the audio device 100 (e.g., the loudspeaker 115) and the listener. In one aspect, the adjusted sound signal may have an adjusted sound level, which may be quieter than a sound level at which the loudspeaker 115 is to produce the sound. In one aspect, a different transfer function than that of the one used at block 415 may be applied at this operation.

The mitigator 225 obtains an input microphone signal that represents the ambient sound of the acoustic environment in which the audio device 100 is located (at block 425). In one aspect, the microphone signal is produced by the microphone 210. At this block, the mitigator 225 determines whether the desired sound as heard by the user or the ambient sound may be used as a masking threshold based on which sound is louder than the other (e.g., which sound has a maximum sound level). Specifically, the mitigator 225 compares the desired sound and the ambient sound to determine which sound has a higher masking effect at the user's position. For example, the mitigator compares both signals to determine which will be perceived by the user as being louder. In one aspect, the mitigator 225 determines which signal has a higher sound energy level, thereby being the louder sound perceived by the user. For example, the mitigator 225 may choose the signal with the most sound energy, over a given frequency spectrum. In one aspect, the mitigator 225 may compare the sound pressure level (SPL) of each signal, and choose the signal with the higher SPL than the other. The mitigator 225 may compare sound energy levels of certain frequency bins and choose the signal with the frequency bin with the higher energy level to be the masking threshold. In some aspects, the mitigator 225 may compare the two signals and choose the one with greater (positive and negative) amplitude. In one aspect, the device-to-ears transfer function may be applied to the input microphone signal.

In one aspect, rather than choosing one signal as the masking threshold, the mitigator 225 may produce a masking threshold based on a combination of two or more signals. For example, since both the desired sound and ambient sound are perceived together, there may be constructive interference, thereby increasing the loudness of sound that may mask the loudspeaker-induced noise. Thus, in some aspects, the mitigator 225 may produce a masking threshold by selecting sound energy levels of certain frequency components from each signal. In one aspect, the mitigator 225 may add the two signals together and extrapolate portions that result in constructive interference. As a result, the mitigator 225 produces a masking threshold from the desired sound and/or ambient sound. In one aspect, the mitigator 225 may apply a normalization filter upon the adjusted audio input signal and the ambient sound signal to normalize the signals before performing the comparison at block 425.

In another aspect, the mitigator 225 may determine the masking threshold based on a predefined auditory threshold, below which sound is not perceived by an average person. In one aspect, the auditory threshold is determined in a controlled environment. Specifically, the mitigator 225 may use the predefined auditory threshold as a baseline for the masking threshold. The mitigator 225 may then adjust the masking threshold according to the adjusted audio input signal and/or the microphone signal. In one aspect, the threshold may be based on the device-to-ears transfer function that was applied at block 415.

The mitigator 225 compares the audibility of the loudspeaker-induced noise with the produced masking threshold to determine if the noise is audible at the listener's position (at block 430). Specifically, the mitigator 225 determines if at least a portion of the adjusted noise signal exceeds the masking threshold. For example, the mitigator 225 may determine whether the amplitude of the portion of the adjusted noise signal exceeds the masking threshold. In one aspect, the mitigator 225 may determine if a noise level of a particular frequency component of the adjusted noise signal is above the masking threshold, such as illustrated in graph 101 of FIG. 1. This type of determination is "on-frequency" masking, in which the mask and the signal are within the same frequency component. In other aspects, the mitigator 225 may determine if an energy level of one frequency component of the adjusted audio signal is masked (or below) an energy level of a different frequency component through "off-frequency" masking. In some aspects, the mitigator 225 may apply another normalization filter upon the adjusted noise signal before comparing the audibility at block 430. In one aspect, the normalization filter may be the same or different filter used to normalize the audio input signal and the ambient sound signal.

The mitigator 225 processes the audio input signal to mitigate the audibility of the loudspeaker-induced noise, based on the portion of the noise signal that exceeds the masking threshold (at block 435). In one aspect, the mitigator 225 may determine a gain adjustment by performing an audibility to gain function upon the portion of the noise signal that exceeds the masking threshold to determine how much of a gain adjustment is necessary to reduce the noise level of the noise signal below the masking threshold. Upon determining the gain adjustment, the mitigator may apply the gain adjustment to the audio input signal to produce a gain adjusted audio input signal. In one aspect, the gain adjustment may attenuate the audio input signal causing the loudspeaker 115 to produce the audio system desired sound at a lower volume. In the case in which the noise is port noise, by lowering the volume the air velocity within the port 125 may decrease, resulting in a port noise with a lower noise level. Although the desired sound is produced at a lower sound level, the noise level of the port noise may be reduced to below the sound level of the desired sound, thereby being masked by (or indistinguishable from) the desired sound.

In one aspect, the mitigator 225 may spectral shape the audio input signal based on the portion of the noise signal that exceeds the masking threshold. For instance, if the noise level of the noise signal exceeds the masking threshold in a low frequency region, the mitigator 225 may spectral shape the audio input signal to compensate for the portion that exceeds the masking threshold by boasting (or attenuating) the audio input signal's low frequency content. In some aspects, the mitigator 225 may apply audio processing filters upon the audio input signal, such as low-pass, high-pass, or band-pass filters according to the audibility of the noise. The processed audio input signal is used to drive the loudspeaker 115 to produce the desired sound, which upon being perceived by the user masks the loudspeaker-induced noise that is caused by the audio device 100.

Some aspects perform variations of the operations described in the block diagram 400. For example, the specific operations of the block diagram 400 may not be performed in the exact order shown and described. The specific operations may not be performed in one continuous series of operations, and different specific operations may be performed in different aspects. In one aspect, specific operations may be omitted. For example, operations described in blocks 420 and 425 may be omitted. In this case, the audio device 100 may determine (at block 430) the audibility of the loudspeaker-induced acoustic noise according to the predefined audibility threshold, as previously described. The mitigator 225 may compare the loudspeaker-induced noise to the auditory threshold to determine whether the noise may be heard by the listener. If so, at block 435 the mitigator 225 may process the noise in order to reduce the noise below the threshold.

In some aspects, another variation of the operations includes omitting the application of the device-to-ears transfer function in blocks 415 and 420. In this variation, the mitigator 225 may not apply the transfer function when the device is below a particular threshold distance from the listener.

As previously described, some conventional approaches reduce noise produced by a resonating mechanical component upon a determination that a strength of a frequency component in an audio signal exceeds a threshold. As a result, such approaches may modify the audio signal by configuring a filter regardless of whether the noise is a nuisance to the listener. Thus, such approaches may degrade the sound quality of desired sound, even when noise induced by the loudspeaker would not be audible over the desired sound.

Figure 5:
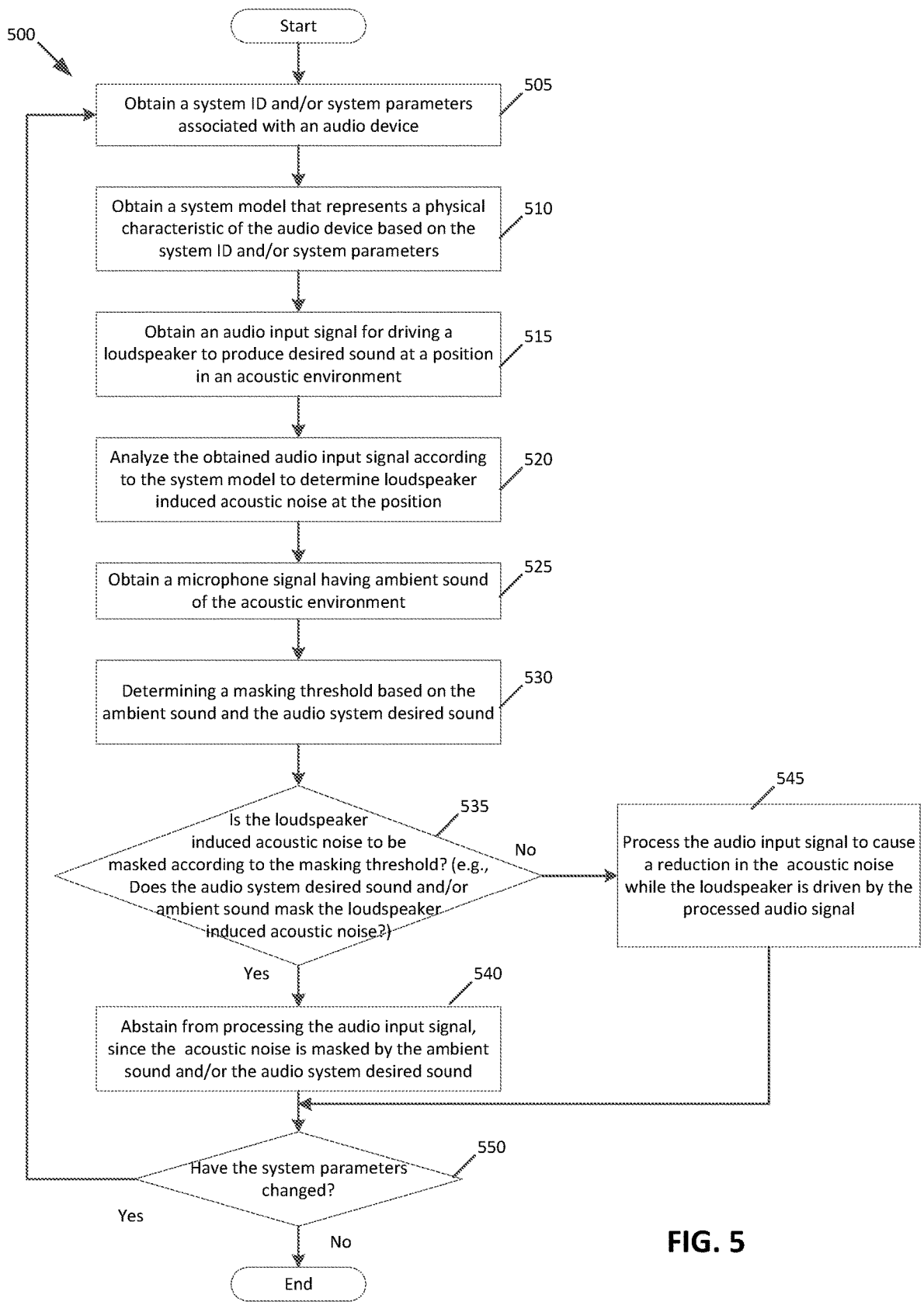
FIG. 5 is a flowchart of another aspect to perform a noise mitigation process.

Thus, in one aspect, the present disclosure illustrates that the controller 215 is to intervene (e.g., process the audio signal), upon a determination that the loudspeaker-induced noise is audible. To illustrate, FIG. 5 is a flowchart of one aspect of a process 500 to dynamically mitigate loudspeaker-induced noise. In one aspect, the process 500 is performed by the controller 215 of the audio device 100 as described in FIG. 2. More specifically, the process 500 may be performed by the predictor 220 and/or mitigator 225 of the controller 215. The process 500 will be described with reference to FIGS. 2-4. For instance, some operations described in process 500, such as blocks 515, 510, 520, 535, and 545, may be the same or similar to operations 305-325 described in process 300 of FIG. 3, respectively. The process 500 begins by obtaining a system identifier and/or system parameters associated with an audio device 100 (at block 505). In one aspect, the system parameters may be associated specifically with a physical characteristic of the audio device 100. The process 500 obtains a system model that represents a modeled physical characteristic of the audio device 100 based on the system identifier and/or the system parameters (at block 510).

The process 500 obtains an audio input signal for driving the loudspeaker 115 to produce desired sound at a position in an acoustic environment (at block 515). The process 500 analyzes the obtained audio input signal according to the system model to determine loudspeaker-induced noise at the position in the acoustic environment (at block 520). The process 500 obtains a microphone signal (from the microphone 210) having ambient sound captured by the microphone 210 of the acoustic environment (at block 525). The process 500 determines a masking threshold based on the ambient sound and the desired sound (at block 530). The process 500 determines if the loudspeaker-induced noise is to be masked according to the masking threshold, such that if the noise were induced it would be masked by at least one of the ambient sound or the audio system desired sound (at decision block 535). If the noise is lower than the masking threshold, the process 500 abstains from processing the audio input signal. In one aspect, the controller abstains from processing the audio input signal because the noise is already to be masked by at least one of the ambient sound or the desired sound. Thus, in contrast to other conventional approaches that attempt to eliminate noise, the present disclosure does not attempt to reduce or eliminate noise if that noise is not audible over other sounds in the acoustic environment. In one aspect, the abstention is of additional processing that may otherwise be performed by the controller 215 upon the audio input signal in order to reduce the noise caused by the system as a result of the loudspeaker 115 producing the desired sound, as described in FIG. 3.

If, however, the loudspeaker-induced noise will not be masked by other sounds that are to be perceived by the user according to the masking threshold, the process 500 processes the audio input signal to cause a reduction in the acoustic noise when the loudspeaker 115 is driven by the processed audio signal (at block 545).

The process 500 determines if any of the system parameters have changed (at decision block 550). Specifically, the controller 215 determines if there have been any changes to the audio device 100 that may affect the loudspeaker-induced noise caused by the loudspeaker 115. For instance, in the case of a physical button that may have been causing the noise, the system parameters may indicate that the button has gone from being depressed to back to its normal state. As a result, the process 500 returns back to block 505 to obtain another system ID and/or system parameters, which may have changed. In one aspect, this means obtaining a modified system model of the physical button to account for its current position. If, however, the parameters of the audio device 100 have not changed, the process 500 ends.

Some aspects perform variations of the process 500. For example, the specific operations of the process 500 may not be performed in the exact order shown and described. The specific operations may not be performed in one continuous series of operations, and different specific operations may be performed in different aspects. For example, the process 500 may determine the masking threshold based on either one of the audio input signal or the microphone signal. Thus, in the case of only using the audio input signal to determine the masking threshold, the process 500 may not perform the operations of block 525. In one aspect, the process 500 may include an additional operation of driving the loudspeaker 115 to produce the audio system desired sound after blocks 540-545.

In another aspect, the process 500 may perform the operations in a different order. For example, the process 500 may begin with obtaining a system model (at block 510) and an audio input audio signal (at block 515). Next, the process 500 may obtain a system ID and/or system parameters (at block 505). In this aspect, the obtained system model may be a generic system model, which is modified according to the obtained system parameters, as described herein.

In one aspect, the processes described herein, such as processes 300 and 500 of FIGS. 3 and 5, may be continuous processes that are performed upon user-desired audio until such audio has terminated. In another aspect, the processes may be performed intermittently. For example, process 300 may be performed between preset intervals of time, such as every five seconds.

As previously explained, an aspect of the disclosure may be a non-transitory machine-readable medium (such as microelectronic memory) having stored thereon instructions, which program one or more data processing components (generically referred to here as a "processor") to perform the network operations, signal processing operations, and audio signal processing operations. In other aspects, some of these operations might be performed by specific hardware components that contain hardwired logic. Those operations might alternatively be performed by any combination of programmed data processing components and fixed hardwired circuit components.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A method for mitigating noise caused by a loudspeaker in an audio device, the method comprising:
    obtaining an audio signal for driving a loudspeaker;
    obtaining a system model of the audio device, wherein the system model represents a modeled physical characteristic of the audio device;
    determining whether a noise level of loudspeaker induced acoustic noise is greater than a desired sound level by analyzing the audio signal according to the system model, wherein the noise level and the desired sound level are characterized at a listener's position in an acoustic environment; and
    in response to determining that the noise level is greater than the desired sound level, processing the audio signal to cause a reduction of the noise level.

2. The method of claim 1 further comprising
    obtaining a transfer function that represents a response between the loudspeaker of the audio device and the listener's position in the acoustic environment; and
    analyzing the audio signal according to the transfer function to determine the desired sound level at the listener's position in the acoustic environment.

3. The method of claim 2, wherein analyzing the audio signal according to the system model comprises estimating a noise signal that represents the loudspeaker induced acoustic noise, wherein the method further comprises
    analyzing the noise signal according to the transfer function to determine the noise level of the loudspeaker induced acoustic noise at the listener's position in the acoustic environment.

4. The method of claim 3 the method further comprising:
    obtaining an input microphone signal from a microphone of the audio device that is configured to sense ambient sound of the acoustic environment;
    determining a masking threshold based on a combination of the ambient sound of the input microphone signal and the desired sound at the position in the acoustic environment; and
    processing the audio signal according to a difference between the masking threshold and the noise level to cause a reduction in the noise level only when the noise level at the listener's position in the acoustic environment is above the masking threshold.

5. The method of claim 4, wherein processing the audio signal comprises spectral shaping the audio signal to compensate for spectral audio components of the loudspeaker induced acoustic noise that are above the masking threshold.

6. The method of claim 1, wherein the desired sound level is a first desired sound level, wherein processing the audio signal comprises:
    determining a gain adjustment for the audio signal based on a difference between the noise level of the acoustic noise and the first desired sound level of the desired sound at the listener's position in the acoustic environment;
    applying the gain adjustment to the audio signal to produce a gain adjusted audio signal; and
    driving the loudspeaker with the gain adjusted audio signal to produce desired sound having a second desired sound level at the listener's position in the acoustic environment in order for the acoustic noise to be masked by the desired sound.

7. The method of claim 1 further comprising, in response to determining that the noise level is less than the desired sound level, driving the loudspeaker using the obtained audio signal to produce desired sound.

8. An audio device comprising:
    a loudspeaker;
    a microphone;
    a housing having the loudspeaker and the microphone integrated therein;
    a processor; and
    memory having stored therein instructions which when executed by the processor cause the audio device to
        obtain an audio signal for driving the loudspeaker;
        obtain a system model of the audio device, wherein the system model represents a physical characteristic of the audio device;
        determine whether a noise level of loudspeaker induced acoustic noise is greater than a desired sound level based on the audio signal and the system model, wherein the noise level and the desired sound level correspond to a position in an acoustic environment; and
        process the audio signal to cause a reduction of the noise level only when the noise level is greater than the desired sound level.

9. The audio device of claim 8, wherein the memory stores further instructions that cause the audio device to obtain a transfer function that represents a response between the loudspeaker of the audio device and the position in the acoustic environment; and analyze the audio signal according to the transfer function to determine the desired sound level at the position in the acoustic environment.

10. The audio device of claim 9, wherein the instructions to determine whether the noise level of the loudspeaker induced acoustic noise is greater than the desired sound level based on the audio signal and system model comprises instructions to apply the system model to the audio signal to estimate a noise signal that represents the loudspeaker induced acoustic noise, wherein the memory has further instructions that cause the audio device to analyze the noise signal according to the transfer function to determine the noise level of the acoustic noise at the position in the acoustic environment.

11. The audio device of claim 10, wherein the memory stores further instructions that cause the audio device to obtain an input microphone signal from the microphone of ambient sound within the acoustic environment;

determine a masking threshold based on a combination of the ambient sound of the input microphone signal and the desired sound at the position in the acoustic environment; and process the audio signal according to a difference between the masking threshold and the noise level to cause a reduction in the noise level only when the noise level at the position in the acoustic environment is above the masking threshold.

12. The audio device of claim 11, wherein the instructions to process the audio signal comprises instructions to spectral shape the audio signal to compensate for spectral audio components of the loudspeaker induced acoustic noise that are above the masking threshold.

13. The audio device of claim 8, wherein the desired sound level is a first desired sound level, wherein the instructions to process the audio signal comprises instructions to determine a gain adjustment for the audio signal based on a difference between the noise level of the acoustic noise and the desired sound level of the desired sound at the position in the acoustic environment;

apply the gain adjustment to the audio signal to produce a gain adjusted audio signal; and driving the loudspeaker with the gain adjusted audio signal to produce desired sound having a second desired sound level at the position in the acoustic environment.

14. The audio device of claim 8, wherein the memory stores further instructions that cause the audio device to, in response to the determination that the noise level is less than the desired sound level, use the obtained audio signal to drive the loudspeaker to produce desired sound.

15. An article of manufacture comprising a machine-readable medium having instructions stored therein that when executed by a processor of an audio device having a loudspeaker obtain an audio signal for driving the loudspeaker;

obtain a system model of the audio device, wherein the system model represents a physical characteristic of the audio device;

determine whether a noise level of loudspeaker induced acoustic noise is greater than a desired sound level by analyzing the audio signal according to the system model, wherein the noise level and the desired sound level are characterized at a position in an acoustic environment; and in response to determining that the noise level is greater than the desired sound level, process the audio signal to cause a reduction of the noise level.

16. The article of manufacture of claim 15, wherein the machine-readable medium stores further instructions that when executed by the processor obtain a transfer function that represents a response between the loudspeaker of the audio device and the position in the acoustic environment; and analyze the audio signal according to the transfer function to determine the desired sound level at the position in the acoustic environment.

17. The article of manufacture of claim 16, wherein the instructions to analyze the audio signal according to the system model comprise instructions to estimate a noise signal that represents the loudspeaker induced acoustic noise, wherein the medium stores further instructions that when executed by the processor analyze the noise signal according to the transfer function to determine the noise level of the loudspeaker induced acoustic noise at the position in the acoustic environment.

18. The article of manufacture of claim 17, wherein the machine-readable medium stores further instructions that when executed by the processor obtain an input microphone signal from the microphone of ambient sound within the acoustic environment;

determine a masking threshold based on a combination of the ambient sound of the input microphone signal and the desired sound at the position in the acoustic environment; and process the audio signal according to a difference between the masking threshold and the noise level to cause a reduction in the noise level only when the noise level at the position in the acoustic environment is above the masking threshold.

19. The article of manufacture of claim 18, wherein the instructions to process the audio signal comprises instructions to spectral shape the audio signal to compensate for spectral audio components of the loudspeaker induced acoustic noise that are above the masking threshold.

20. The article of manufacture of claim 15, wherein the desired sound level is a first desired sound level, wherein the instructions to process the audio signal comprises instructions to determine a gain adjustment for the audio signal based on a difference between the noise level of the acoustic noise and the first desired sound level of the desired sound at the position in the acoustic environment;

apply the gain adjustment to the audio signal to produce a gain adjusted audio signal; and drive the loudspeaker with the gain adjusted audio signal to produce desired sound having a second desired sound level at the position in the acoustic environment in order for the acoustic noise to be masked by the desired sound.

* * * * *